United States Patent
Yoo et al.

(10) Patent No.: US 10,510,302 B2
(45) Date of Patent: Dec. 17, 2019

(54) ELECTROLUMINESCENT DISPLAY DEVICE

(71) Applicant: LG Display Co., Ltd., Seoul (KR)

(72) Inventors: Juhn-Suk Yoo, Seoul (KR); Woo-Hyun Kwon, Seoul (KR)

(73) Assignee: LG Display Co., Ltd., Seoul (KR)

( * ) Notice: Subject to any disclaimer, the term of this patent is extended or adjusted under 35 U.S.C. 154(b) by 50 days.

(21) Appl. No.: 15/854,330

(22) Filed: Dec. 26, 2017

(65) Prior Publication Data

US 2018/0182302 A1 Jun. 28, 2018

(30) Foreign Application Priority Data

Dec. 28, 2016 (KR) .................. 10-2016-0181411

(51) Int. Cl.
*G09G 3/3266* (2016.01)
*G09G 3/3225* (2016.01)
*H01L 27/32* (2006.01)

(52) U.S. Cl.
CPC ......... *G09G 3/3266* (2013.01); *G09G 3/3225* (2013.01); *H01L 27/3262* (2013.01); *H01L 27/3265* (2013.01); *H01L 27/3276* (2013.01)

(58) Field of Classification Search
CPC .. G09G 3/3266; G09G 3/3225; G09G 3/3233; G09G 2300/0819; G09G 2300/0852; G09G 2300/0876; G09G 2310/0251; G09G 2310/0262; H01L 27/3262; H01L 27/3265; H01L 27/3276; H01L 51/0554; H01L 2/1255
See application file for complete search history.

(56) References Cited

U.S. PATENT DOCUMENTS

| | | | |
|---|---|---|---|
| 2009/0135104 A1* | 5/2009 | Jeong | H01L 27/3276 345/76 |
| 2010/0079430 A1* | 4/2010 | Yamashita | G09G 3/3233 345/210 |
| 2013/0214276 A1* | 8/2013 | Kubota | H01L 27/326 257/57 |
| 2015/0009105 A1* | 1/2015 | Nomura | G09G 3/006 345/76 |
| 2015/0060814 A1* | 3/2015 | Noh | H01L 27/3272 257/40 |
| 2015/0179724 A1* | 6/2015 | Lee | H01L 27/3241 257/40 |
| 2016/0035805 A1 | 2/2016 | Kim et al. | |
| 2016/0217733 A1 | 7/2016 | Kim et al. | |
| 2016/0293103 A1* | 10/2016 | Kimura | G09G 3/3233 |
| 2016/0322442 A1 | 11/2016 | Lee et al. | |
| 2016/0329390 A1* | 11/2016 | Ono | H01L 27/3262 |

OTHER PUBLICATIONS

Extended European Search Report dated May 29, 2018, issued in corresponding European Patent Application No. 17207039.3.

* cited by examiner

Primary Examiner — Kent W Chang
Assistant Examiner — Sujit Shah
(74) Attorney, Agent, or Firm — Morgan, Lewis & Bockius LLP

(57) ABSTRACT

A display device includes a driving thin film transistor (TFT) having a two-gate overlap structure and a power line having a width extension structure that together allow for improved storage capacitance when compared to a display device without such structures.

11 Claims, 7 Drawing Sheets

ELECTROLUMINESCENT DISPLAY DEVICE

The present application claims the benefit of Korean Patent Application No. 10-2016-0181411 filed in Korea on Dec. 28, 2016, which is hereby incorporated by reference.

BACKGROUND

Technical Field

The present disclosure relates to an electroluminescent display device and more particularly to an electroluminescent display device having an improved storage capacitance.

Discussion of the Related Art

Among flat panel display devices, since an electroluminescent display device is a self-emission type, the electroluminescent display device has excellent characteristics of a wide viewing angle, a high contrast ratio in comparison to a liquid crystal display device and also the electroluminescent display device has characteristics of a thin profile and low power consumption because the electroluminescent display device does not need a back-light unit.

In addition, the electroluminescent display device can be driven by a direct low voltage and has advantages in a response time, external impact resistance, production cost, wide operating temperate range, and so on.

In an active matrix type electroluminescent display device, the voltage controlling the current applied to the pixel is charged in a storage capacitor such that the voltage is maintained until next frame. Accordingly, regardless of the number of the gate lines, the active matrix type electroluminescent display device has an emission state during one image displaying period.

FIG. 1 is a circuit diagram of one pixel region of the related art electroluminescent display device.

As shown in FIG. 1, in an electroluminescent display device, a gate line GL, a data line DL and a power line PL are formed, and a pixel region P is defined by the gate and data lines GL and DL. In the pixel region P, a switching thin film transistor (TFT) Ts, a driving TFT Td, a storage capacitor Cst and an emitting diode D are formed.

The switching TFT Ts is connected to the gate line GL and the data line DL, and the driving TFT Td and the storage capacitor Cst are connected between the switching TFT Ts and the power line PL. The emitting diode D is connected to the driving TFT Td.

In such electroluminescent display device, when the switching TFT Ts is turned on by a gate signal applied through the gate line GL, a data signal from the data line DL is applied to a gate electrode of the driving TFT Td and an electrode of the storage capacitor Cst through the switching TFT Ts. When the driving TFT Td is turned on by the data signal, an electric current is supplied to the organic emitting diode D from the power line PL through the driving TFT Td. As a result, the emitting diode D emits light in proportion to the current passing through the driving TFT Td.

At the same time, the storage capacitor Cst is charged with the voltage in proportion to the date signal and the storage capacitor Cst serves to maintain the voltage of the gate electrode of the driving TFT Td for one frame. Accordingly, the electroluminescent display device can display images.

However, in the related art electroluminescent display device, a threshold voltage of the driving TFT Td is fluctuated (or changed) such that there is a problem in providing a desired image display. In addition, since there is a limitation of the storage capacitance, the driving property of the electroluminescent display device is decreased.

SUMMARY

Accordingly, embodiments of the present disclosure are directed to an electroluminescent display device that substantially obviates one or more of the problems due to limitations and disadvantages of the related art.

An aspect of the present disclosure is to provide an electroluminescent display device having an improved storage capacitance.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a display device comprises a driving thin film transistor (TFT) having a two-gate overlap structure and a power line having a width extension structure that together allow for improved storage capacitance when compared to a display device without such structures.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles.

DETAILED DESCRIPTION

Reference will now be made in detail to embodiments of the present disclosure, examples of which are illustrated in the accompanying drawings.

Figure 1:
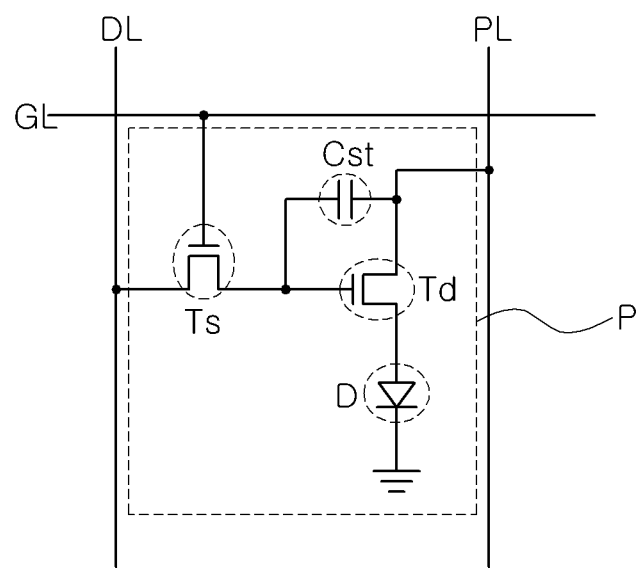
FIG. 1 is a circuit diagram of one pixel region of the related art electroluminescent display device.
Figure 2:
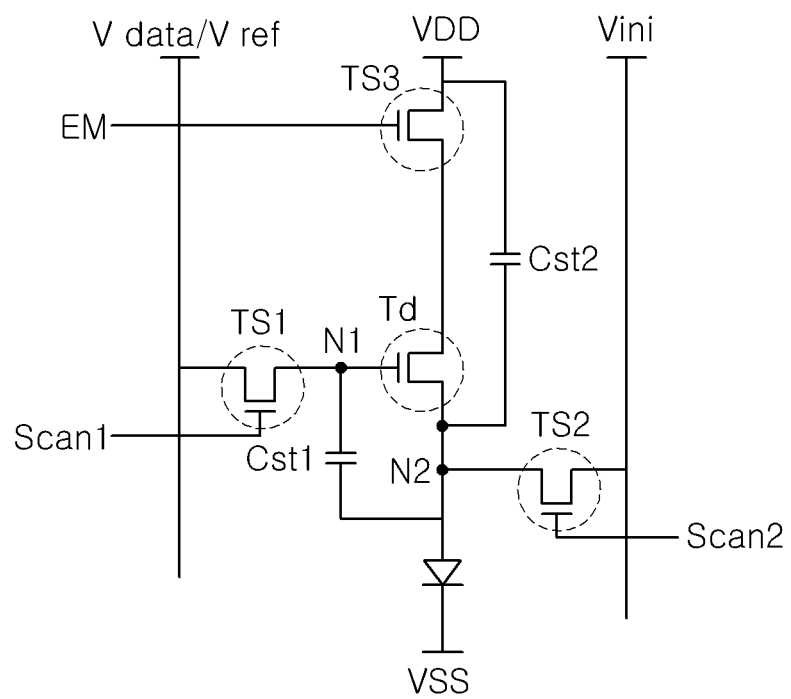
FIG. 2 is a schematic circuit diagram of one pixel region of an electroluminescent display device according to the present invention.

FIG. 2 is a schematic circuit diagram of one pixel region of an electroluminescent display device according to the present invention.

Referring to FIG. 2, an electroluminescent display device includes an emitting diode D, a driving TFT Td, first to third switching TFTS TS1, TS2 and TS3 and first and second capacitors Cst1 and Cst2 in one pixel region. The electroluminescent display device may be referred to as a 4T2C type.

The electroluminescent display device may be driven by an initial period, a sampling period, a programming period and an emitting period.

The first switching TFT TS1 is turned on or turned off based on a first scan signal Scan1. When the first switching TFT TS1 is turned on, a first nod N1, which is connected to a gate electrode of the driving TFT Td, and a data line DL is connected. In the initial period, the first scan signal Scan1 of high level is applied to the first switching TFT TS1 to turn on the first switching TFT TS1. Accordingly, in the initial period, a reference voltage Vref is applied to the first nod N1 from the data line DL through the first switching TFT TS1. In addition, in the programming period, the first scan signal Scan1 of high level is applied to the first switching TFT TS1. In the programming period, a data voltage Vdata is applied to the first nod N1 from the data line DL through the first switching TFT TS1.

The second switching TFT TS2 is turned on or turned off based on a second scan signal Scan2. In the initial period, the second switching TFT TS2 is turned on such that an initial voltage Vini is applied to a second nod N2, which is connected to a source terminal of the driving TFT Td.

The third switching TFT TS3 is turned on or turned off based on an emission signal EM. In the sampling period and the emitting period, the third switching TFT TS3 applies a high potential driving voltage Vdd from a Vdd supplying line (i.e., a power line PL) to a drain terminal of the driving TFT Td.

The emitting diode D includes a first terminal receiving the high potential driving voltage Vdd and a second terminal receiving a low potential driving voltage Vss. The driving TFT Td is disposed between the Vdd supplying line and a Vss supplying line, and the driving TFT Td and the emitting diode D are connected to the Vdd supplying line and the Vss supplying line in series. The driving TFT Td controls an amount of the electric current in the emitting diode D based on a voltage difference between the source terminal and the gate electrode.

The first capacitor Cst1 is located or connected between the first and second nodes N1 and N2. In the sampling period, the first capacitor Cst1 stores a threshold voltage (Vth) of the driving TFT Td. The second capacitor Cst2 is located or connected between the Vdd supplying line and the second node N2.

In the electroluminescent display device, the fluctuation of the threshold voltage of the driving TFT Td is compensated such that degradation of the display quality is prevented.

Figure 3:
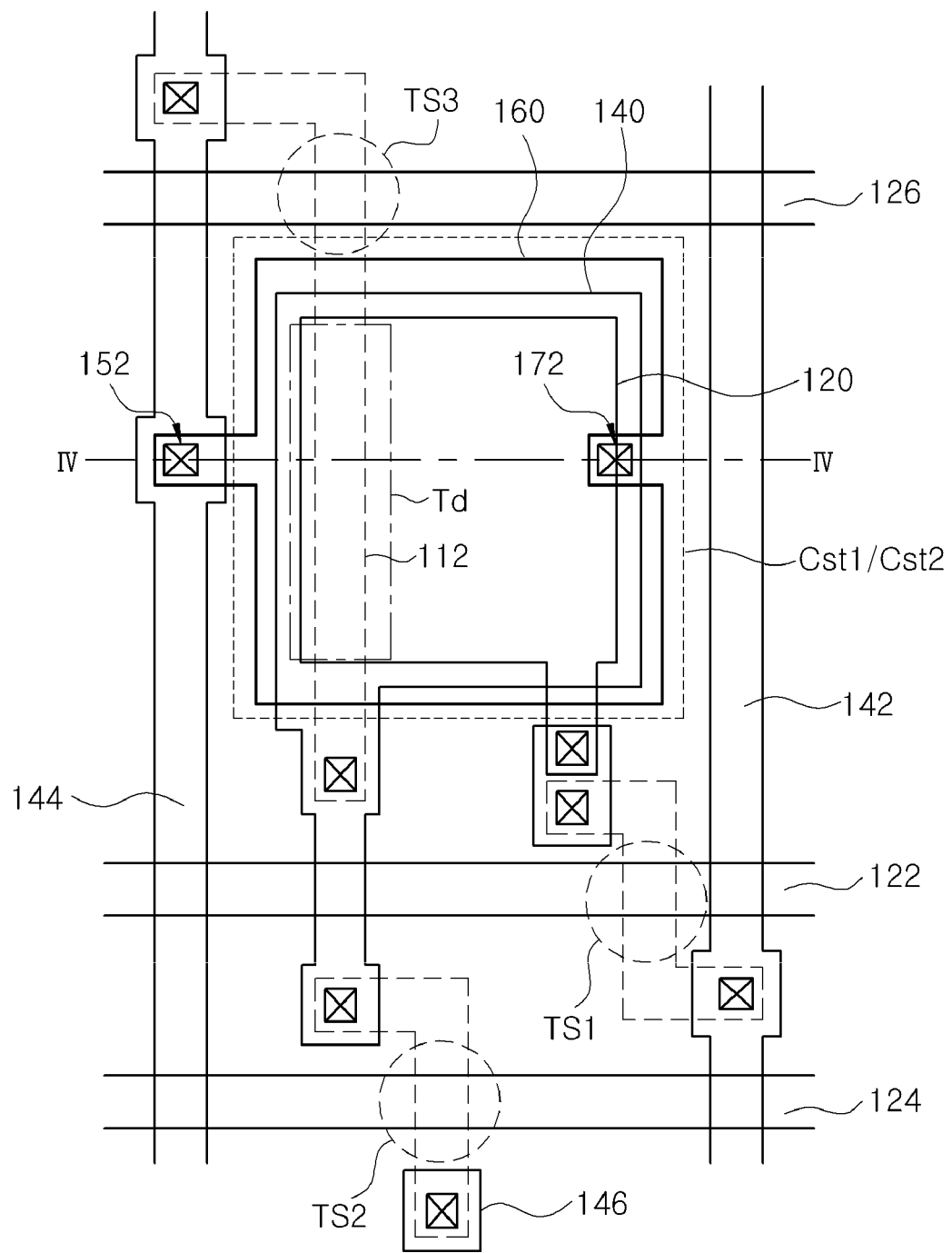
FIG. 3 is a schematic plane view of one pixel region of an electroluminescent display device according to a first embodiment of the present invention.
Figure 4:
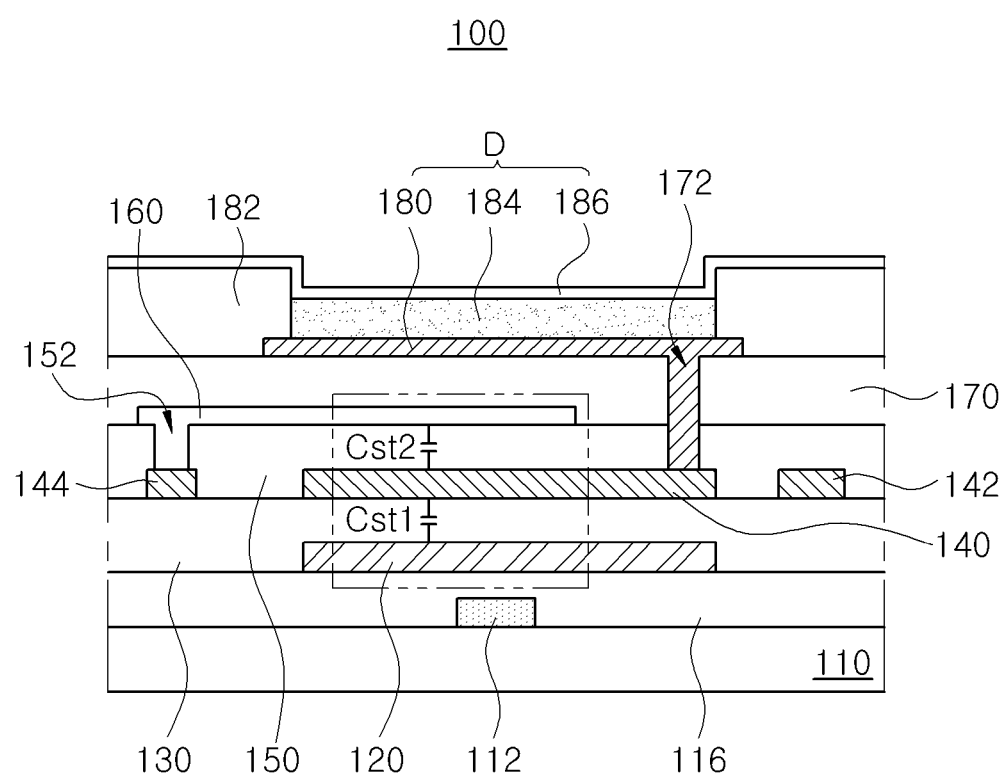
FIG. 4 is a cross-sectional view taken along the line IV-IV of FIG. 3.

FIG. 3 is a schematic plane view of one pixel region of an electroluminescent display device according to a first embodiment of the present invention, and FIG. 4 is a cross-sectional view taken along the line IV-IV of FIG. 3.

Referring to FIGS. 3 and 4, with reference to FIG. 2, an electroluminescent display device 100 according to a first embodiment of the present invention includes an emitting diode D, a driving TFT Td, first to third switching TFTS TS1, TS2 and TS3 and first and second capacitors Cst1 and Cst2.

In addition, the electroluminescent display device 100 includes first and second scan signal lines 122 and 124 along a first direction, an emitting signal line 126, a data line 142 along a second direction crossing the first direction, a power line 144 and an initial signal line 146. The first and second scan signal lines 122 and 124 and the emitting signal line 126 extend along a first direction, and the data line 142, the power line 144 and the initial signal line 146 extend along a second direction crossing the first direction.

The first switching TFT TS1 is connected to the first scan signal line 122 and the data line 142, and the second switching TFT TS2 is connected to the initial signal line 146 and the driving TFT Td. The third switching TFT TS3 is connected to the emitting signal line 126 and the driving TFT Td, and the driving TFT Td is connected to the first switching TFT TS1 and the emitting diode D.

In addition, the first capacitor Cst1 is connected between a source terminal of the first switching TFT TS1, i.e., a gate electrode 120 of the driving TFT Td, and a source terminal 140 of the driving TFT Td. The second capacitor Cst2 is connected between the power line 144 and the source terminal 140 of the driving TFT Td.

In more detail, an active layer 112 of a semiconductor material is formed on a substrate 110, and a gate insulating layer 116 is formed over the substrate 110 to cover the active layer 112.

On the gate insulating layer 116, the gate electrode 120 of the driving TFT Td is formed, and an interlayer insulating layer 130 is formed to cover the gate electrode 120.

On the interlayer insulating layer 130, the source terminal 140 of the driving TFT Td, the data line 142 and the power line 144 are formed. The source terminal 140 of the driving TFT Td overlaps the gate electrode 120 of the driving TFT Td to form the first capacitor Cst1. Namely, an overlapped portion of the gate electrode 120 of the driving TFT Td serves as a first capacitor electrode, an overlapped portion of the source terminal 140 of the driving TFT Td serves as a second capacitor electrode, and the interlayer insulating layer 130 therebetween servers as a dielectric layer.

A first passivation layer 150 covering the source terminal 140 of the driving TFT Td, the data line 142 and the power line 144 and having a first contact hole 152, which exposes the power line 144, is formed above the substrate 110, and a third capacitor electrode 160, which is connected to the power line 144 through the first contact hole 152, is formed on the first passivation layer 150. For example, the third capacitor electrode 160 may be formed on the same layer and of the same material as a shield metal layer for preventing a cross-talk in adjacent pixel regions.

The third capacitor electrode 160 overlaps the second capacitor electrode as a portion of the source terminal 140 of the driving TFT Td. Accordingly, the second capacitor electrode, the third capacitor electrode 160 and the first passivation layer 150 therebetween constitute the second capacitor Cst2.

A second passivation layer 170 is formed on the third capacitor electrode 160. A second contact hole 172 exposing the source terminal 140 of the driving TFT Td is formed through the second passivation layer 170 and the first passivation layer 150.

On the second passivation layer 170, a first electrode 180, which is connected to the source terminal 140 of the driving TFT Td through the second contact hole 172, and a bank 182, which covers an edge of the first electrode 180, are formed.

An emitting layer 184 is formed on the first electrode 180 surrounded by the bank 182, and a second electrode 186 is formed over an entire surface of the substrate 110 covering the bank 182 and the emitting layer 184.

The first electrode 180, the emitting layer 184 and the second electrode 186 constitute the emitting diode D.

The first electrode 180 may be formed of a conductive material having a relatively high work function to serve as an anode. For example, the first electrode 180 may be formed of a transparent conductive material, e.g., indium-tin-oxide (ITO) or indium-zinc-oxide (IZO).

In addition, the first electrode 180 may further include a reflection layer or a reflection electrode to have a multi-layered structure. For example, the first electrode 180 may have a triple-layered structure of first and second layers, each of which is formed of ITO, and a third layer, which is disposed between the first and second layers and is formed of aluminum-palladium-copper (APC) alloy.

The second electrode 186 may be formed of a conductive material having a relatively low work function to serve as a cathode. For example, the second electrode 186 may be formed of one of aluminum (Al), magnesium (Mg) and Al—Mg alloy.

The emitting layer 184 may include an organic emitting material or an inorganic emitting material, e.g., a quantum dot.

As mentioned above, the electroluminescent display device 100 has the 4T2C structure such that the fluctuation of the threshold voltage of the driving TFT Td is compensated. Accordingly, an image quality of the electroluminescent display device is improved. In addition, with the first and second capacitors Cst1 and Cst2, the driving property of the electroluminescent display device 100 is also improved.

However, in the electroluminescent display device 100, the third capacitor electrode 160 of the second capacitor Cst2 should be spaced apart from the second contact hole 172 for connection of the first electrode 180 of the emitting diode D and the source terminal 140 of the driving TFT Td, and the source terminal 140 of the driving TFT Td should be spaced apart from the power line 144.

As a result, there are limitations in an area of the second capacitor Cst2 and in a storage capacitance of the second capacitor Cst2.

Figure 5:
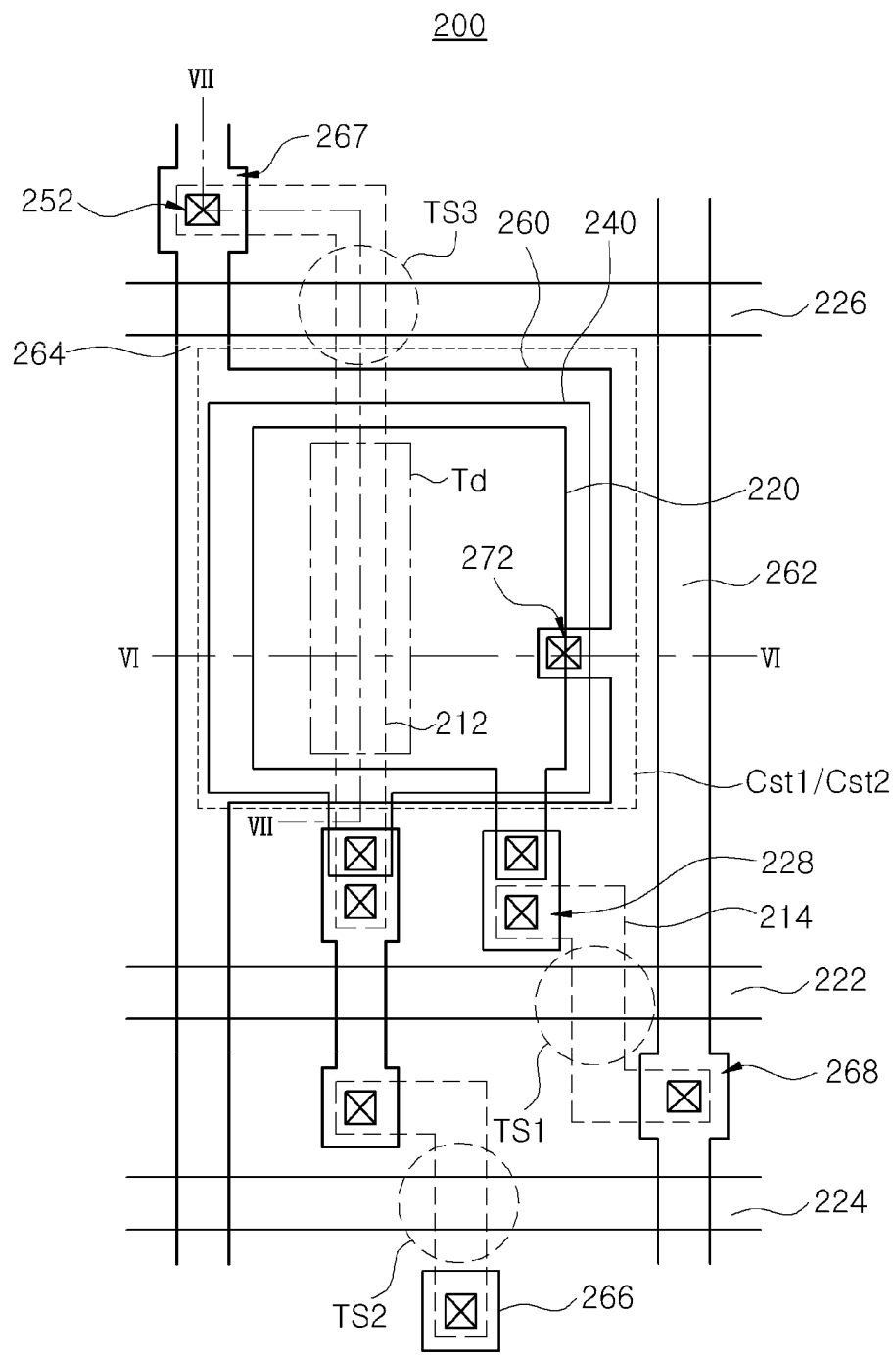
FIG. 5 is a schematic plane view of one pixel region of an electroluminescent display device according to a second embodiment of the present invention.

FIG. 5 is a schematic plane view of one pixel region of an electroluminescent display device according to a second embodiment of the present invention.

Referring to FIG. 5, with respect to FIG. 2, an electroluminescent display device 200 according to a second embodiment of the present invention includes an emitting diode D, a driving TFT Td, first to third switching TFTS TS1, TS2 and TS3 and first and second capacitors Cst1 and Cst2.

In addition, the electroluminescent display device 200 includes first and second scan signal lines 222 and 224, an emitting signal line 226, a data line 262, a power line 264 and an initial signal line 266. The first and second scan signal lines 222 and 224 and the emitting signal line 226 extend along a first direction, and the data line 262, the power line 264 and the initial signal line 266 extend along a second direction crossing the first direction.

The first switching TFT TS1 is connected to the first scan signal line 222 and the data line 262, and the second switching TFT TS2 is connected to the initial signal line 266 and the driving TFT Td. The third switching TFT TS3 is connected to the emitting signal line 226 and the driving TFT Td, and the driving TFT Td is connected to the first switching TFT TS1 and the emitting diode D.

In addition, the first capacitor Cst1 is connected to a source terminal of the first switching TFT TS1, i.e., a gate electrode 220 of the driving TFT Td, and a source terminal 240 of the driving TFT Td. The second capacitor Cst2 is connected to the power line 264 and the source terminal 240 of the driving TFT Td. The first and second capacitors Cst1 and Cst2 overlap each other in a plane view. Here, the source terminal 240 of the driving TFT Td overlapping the gate electrode 220 of the driving TFT Td can be said to form a two-gate overlap structure for the driving TFT Td.

Figure 6:
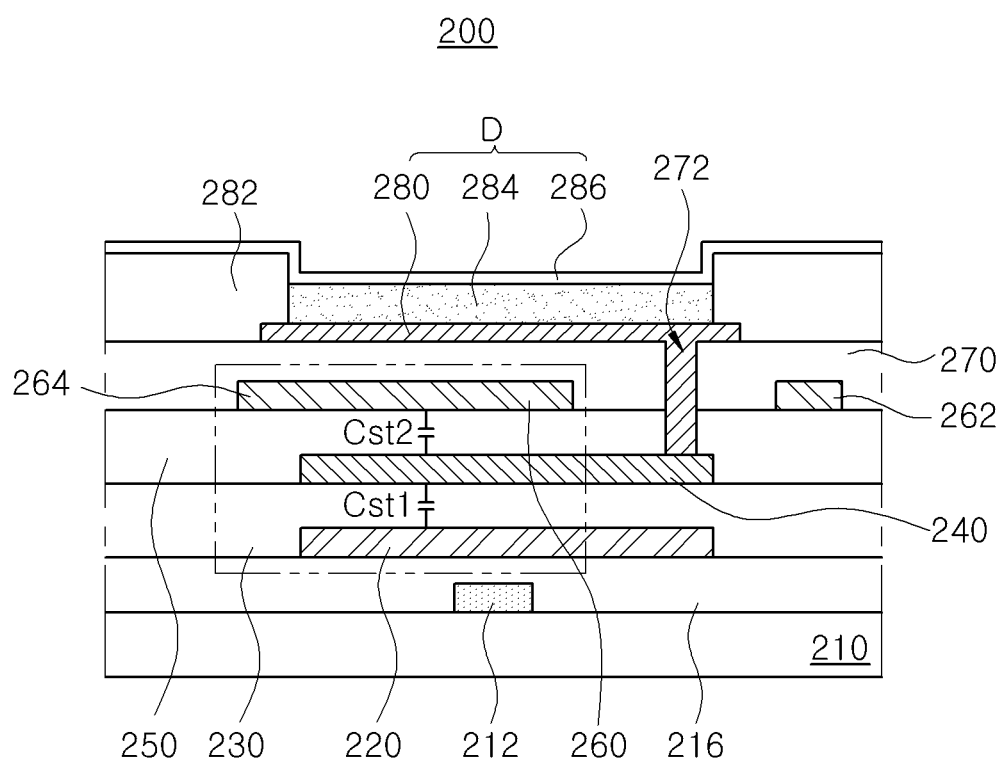
FIG. 6 is a cross-sectional view taken along the line VI-VI of FIG. 5.
Figure 7:
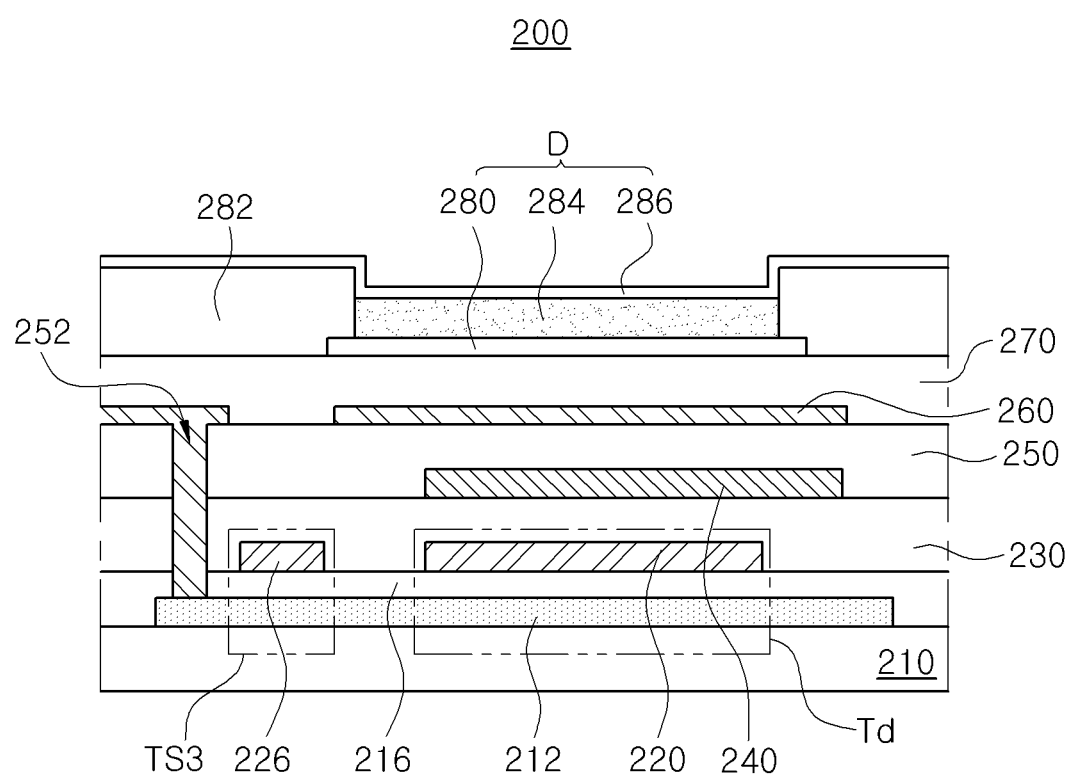
FIG. 7 is a cross-sectional view taken along the line VII-VII of FIG. 5.

FIG. 6 is a cross-sectional view taken along the line VI-VI of FIG. 5, and FIG. 7 is a cross-sectional view taken along the line VII-VII of FIG. 5.

Referring to FIGS. 6 and 7, a semiconductor layer 212 of a semiconductor material is formed on a substrate 210, and a gate insulating layer 216 is formed over the substrate 210 to cover the semiconductor layer 212.

On the gate insulating layer 216, the gate electrode 220 of the driving TFT Td is formed. The gate electrode 220 overlaps the semiconductor layer 212, and the overlapped portion of the semiconductor layer 212 is defined as an active region.

An interlayer insulating layer 230 is formed to cover the gate electrode 220, and the source terminal 240 of the driving TFT Td is formed on the interlayer insulating layer 230.

The source terminal 240 of the driving TFT Td overlaps the gate electrode 220 of the driving TFT Td to form the first capacitor Cst1. Namely, an overlapped portion of the gate electrode 220 of the driving TFT Td serves as a first capacitor electrode, an overlapped portion of the source terminal 240 of the driving TFT Td serves as a second capacitor electrode, and the interlayer insulating layer 230 therebetween servers as a dielectric layer.

A first passivation layer 250 is formed on the source terminal 240 of the driving TFT Td, and the data line 262, the power line 264 and a third capacitor electrode 260 are formed on the first passivation layer 250.

The third capacitor electrode 260 extends (along the same planar layer) from the power line 264 to overlap the second capacitor electrode as a portion of the source terminal 240 of the driving TFT Td. Accordingly, the second capacitor electrode, the third capacitor electrode 260 and the first passivation layer 250 constitute the second capacitor Cst2.

A first contact hole 252 exposing a portion of the semiconductor layer 212 is formed through the first passivation layer 250, the interlayer insulating layer 230 and the gate insulating layer 216, and a portion of the power line 264 contacts the semiconductor layer 212 through the first contact hole 252. The portion of the power line 264 serves as a drain terminal of the driving TFT.

The drain terminal 267 of the driving TFT Td is disposed at the same layer as the power line 264, and the source terminal 240 of the driving TFT Td is disposed under the power line 264. Namely, the source terminal 240 of the driving TFT Td and the drain terminal 267 of the driving TFT Td are disposed at a different layer from each other.

A second passivation layer 270 is formed on the third capacitor 260, the data line 262 and the power line 264. A second contact hole 272 exposing the source terminal 240 of the driving TFT Td is formed through the second passivation layer 270 and the first passivation layer 250.

On the second passivation layer 270, a first electrode 280, which is connected to the source terminal 240 of the driving TFT Td through the second contact hole 272, and a bank 282, which covers an edge of the first electrode 280, are formed.

An emitting layer 284 is formed on the first electrode 280 surrounded by the bank 282, and a second electrode 286 is formed above the substrate 210 to cover the bank 282 and the emitting layer 284.

The first electrode 280, the emitting layer 284 and the second electrode 286 constitute the emitting diode D.

The first electrode 280 may be formed of a conductive material having a relatively high work function to serve as an anode. For example, the first electrode 280 may be formed of a transparent conductive material, e.g., ITO or IZO.

In addition, the first electrode 280 may further include a reflection layer or a reflection electrode to have a multi-layered structure. For example, the first electrode 280 may have a triple-layered structure of first and second layers, each of which is formed of ITO, and a third layer, which is disposed between the first and second layers and is formed of APC alloy.

The second electrode 286 may be formed of a conductive material having a relatively low work function to serve as a cathode. For example, the second electrode 286 may be formed of one of Al, Mg and Al—Mg alloy.

The emitting layer 284 may include an organic emitting material or an inorganic emitting material, e.g., a quantum dot.

As mentioned above, the electroluminescent display device 200 has the 4T2C structure such that the fluctuation of the threshold voltage of the driving TFT Td is compensated. Accordingly, an image quality of the electroluminescent display device is improved.

In addition, with the first and second capacitors Cst1 and Cst2, the driving property of the electroluminescent display device 200 is also improved. Moreover, since the third capacitor electrode 260 for the second capacitor Cst2 directly extends from the power line 264 (along the same planar layer) and is disposed at the same layer as the power line 264, an area of the second capacitor Cst2 is increased.

Namely, since the source terminal 240 of the driving TFT Td as the second capacitor electrode is disposed at a different layer from the power line 264 and the third capacitor electrode 260, the source terminal 240 of the driving TFT Td can be formed under the power line 264 to overlap the power line 264. Accordingly, a portion of the power line 264 serves as the third capacitor electrode 260 such that the area of the second capacitor Cst2 is increased. As a result, the storage capacitance of the capacitors in the electroluminescent display device 200 is increased, and the driving property of the electroluminescent display device 200 is further improved.

Here, it can be said that the driving TFT has a two-gate overlap structure including a second gate electrode over a first gate electrode, whereby the first and second gate electrodes act as a first capacitor. In addition, the data line has a portion of its width extending over the two-gate overlap structure, whereby such width extension and the second gate electrode act as a second capacitor.

It will be apparent to those skilled in the art that various modifications and variations can be made in the electroluminescent display device of the present disclosure without departing from the technical idea or scope of the disclosure. Thus, it is intended that the present disclosure cover the modifications and variations of this disclosure provided they come within the scope of the appended claims and their equivalents.

What is claimed is:
1. An electroluminescent display device, comprising:
a substrate
a scan signal line along a first direction on the substrate;
a data line and a power line along a second direction crossing the first direction;
a switching thin film transistor (TFT) connected to the scan signal line and the data line;
a driving TFT connected to the switching TFT and the power line; and
an emitting diode connected to the driving TFT,
wherein the driving TFT includes a two-gate overlap structure including a second gate electrode over a first gate electrode, the second gate electrode comprising a source terminal of the driving TFT, whereby the first and second gate electrodes are configured to act as a first capacitor,
wherein the power line has a first portion directly extending from the power line over the two-gate overlap structure, whereby the first portion of the power line and the second gate electrode are configure to act as a second capacitor, and
wherein the first portion of the power line is disposed over the second gate electrode and overlaps the first gate electrode in a plane view.

2. The electroluminescent display device of claim 1, further comprising:
a semiconductor layer on the substrate;
a gate insulating layer between the semiconductor layer and the first gate electrode of the driving TFT; and
an interlayer insulating layer between the first gate electrode and the second gate electrode.

3. The electroluminescent display device of claim 2, wherein:
a second portion of the power line contacting the semiconductor layer is configured to serve as a drain terminal of the driving TFT; and
the source terminal of the driving TFT and the drain terminal of the driving TFT are disposed at a different layer from each other.

4. The electroluminescent display device of claim 1, further comprising:
a first passivation layer covering the source terminal, the first passivation layer being under the data line, the power line, and the first portion of the power line; and
a second passivation layer covering the data line and the power line,
wherein the emitting diode includes first and second electrodes and an emitting layer between the first and second electrodes,
wherein a contact hole extends through the first and second passivation layers to expose the source terminal, and
wherein the first electrode is connected to the source terminal through the contact hole.

5. The electroluminescent display device of claim 4, wherein the emitting layer includes an organic emitting material or an inorganic emitting material.

6. The electroluminescent display device of claim 1, wherein a width extension of the power line, which is configured to act as a drain terminal of the driving TFT, extends from the power line along the same plane.

7. An electroluminescent display device, comprising:
a substrate;
a scan signal line along a first direction on the substrate;
a data line and a power line along a second direction crossing the first direction, the power line having a width extension;
a switching thin film transistor (TFT) connected to the scan signal line and the data line;
a driving TFT directly connected to the switching TFT and the power line; and
an emitting diode connected to the driving TFT,
wherein the driving TFT comprises:
a gate that configured to serve as a first capacitor electrode; and
a source that configured to serve as a second capacitor electrode, wherein the width extension is configured to serve as a third capacitor electrode and a drain of the driving TFT, and wherein the gate and the source of the driving TFT constitute a first capacitor, wherein the width extension of the power line and the source of the driving TFT constitute a second capacitor, wherein the source of the driving TFT is over and overlaps the gate of the driving TFT, and wherein the width extension of the power line is over the source of the driving TFT, and overlaps the gate of the driving TFT in a plane view.

8. The electroluminescent display device of claim 7, wherein the third capacitor electrode is formed on the same layer and of the same material as a shield metal layer for preventing a cross-talk in adjacent pixel regions.

9. The electroluminescent display device of claim 7, further comprising:
 a first electrode of the emitting diode;
 a contact hole for connection of the first electrode of the emitting diode and the source terminal of the driving TFT; and
 wherein the third capacitor electrode of the second capacitor is spaced apart from the contact hole.

10. The electroluminescent display device of claim 7, wherein the third capacitor electrode directly extends from the power line and is disposed at the same layer as the power line.

11. The electroluminescent display device of claim 7, wherein the source terminal of the driving TFT is disposed at a different layer from the power line and the third capacitor electrode.

* * * * *